US007658803B2

(12) United States Patent
Park

(10) Patent No.: US 7,658,803 B2
(45) Date of Patent: Feb. 9, 2010

(54) MANUFACTURING AND CLEANSING OF THIN FILM TRANSISTOR PANELS

(75) Inventor: Hong-Sick Park, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 533 days.

(21) Appl. No.: 11/636,008

(22) Filed: Dec. 6, 2006

(65) Prior Publication Data

US 2007/0129274 A1 Jun. 7, 2007

(30) Foreign Application Priority Data

Dec. 6, 2005 (KR) ..................... 10-2005-0117985

(51) Int. Cl.
*G03F 7/42* (2006.01)

(52) U.S. Cl. ........................... 134/1.3; 510/175; 134/2; 134/3; 438/745

(58) Field of Classification Search ................. 510/175; 134/1.3, 2, 3; 438/745
See application file for complete search history.

(56) References Cited

U.S. PATENT DOCUMENTS 5,308,745 A 5/1994 Schwartzkopf
5,968,848 A * 10/1999 Tanabe et al. ............... 438/745
6,638,694 B2 * 10/2003 Ikemoto et al. ............. 430/331
6,723,691 B2 4/2004 Naghshineh et al.
6,815,151 B2 * 11/2004 Tanabe et al. ............... 430/329
6,852,474 B2 * 2/2005 Sabnis ........................ 430/317
7,427,464 B2 * 9/2008 Hatakeyama ............ 430/270.1
2005/0176259 A1 * 8/2005 Yokoi et al. ................. 438/745

FOREIGN PATENT DOCUMENTS

| | | |
|---|---|---|
| JP | 07-331473 | 12/1995 |
| JP | 09-148292 | 6/1997 |
| JP | 2002-523546 | 7/2002 |
| KR | 1994-0012049 | 6/1994 |
| KR | 1020040035368 | 4/2004 |
| KR | 1020040040513 | 5/2004 |
| KR | 1020040083157 | 10/2004 |
| KR | 1020040098751 | 11/2004 |

(Continued)

OTHER PUBLICATIONS

English Language Abstract, KR Patent First Publication No. 1020050015950, Feb. 21, 2005, 1 page.

(Continued)

*Primary Examiner*—Gregory E Webb
(74) *Attorney, Agent, or Firm*—Innovation Counsel LLP

(57) ABSTRACT

A manufacturing a thin film transistor array panel includes depositing a first thin film including aluminum on a substrate, patterning the first thin film by photolithography and etching, cleansing the substrate including the first thin film, and depositing a second thin film on the cleansed substrate. The cleansing is performed using a cleansing material including ultrapure water, cyclic amine, pyrogallol, benzotrizole, and methyl glycol. The cleansing material includes ultrapure water at about 85 wt % to about 99 wt %, cyclic amine at about 0.01 wt % to about 1.0 wt %, pyrogallol at about 0.01 wt % to 1.0 wt %, benzotrizole at about 0.01 wt % to 1.0 wt %, and methyl glycol at about 0.01 wt % to 1.0 wt %.

27 Claims, 16 Drawing Sheets

FOREIGN PATENT DOCUMENTS

| | | |
|---|---|---|
| KR | 1020050015950 | 2/2005 |

OTHER PUBLICATIONS

English Language Abstract, KR Patent First Publication No. 1020040098751, Nov. 26, 2004, 1 page.
English Language Abstract, KR Patent First Publication No. 1020040083157, Oct. 1, 2004, 1 page.
English Language Abstract, KR Patent First Publication No. 1020040040513, May 13, 2004, 1 page.
English Language Abstract, KR Patent First Publication No. 1020040035368, Apr. 29, 2004, 1 page.
English Language Abstract, JP Patent First Publication No. 2002-523546, Jul. 30, 2002, 1 page.
English Language Abstract, JP Patent First Publication No. 09-148292, Jun. 6, 1997, 1 page.
English Language Abstract, JP Patent First Publication No. 07-331473, Dec. 19, 1995, 1 page.
English Language Abstract, KR Patent First Publication No. 1994-0012049, Jun. 22, 1994, 1 page.

* cited by examiner

MANUFACTURING AND CLEANSING OF THIN FILM TRANSISTOR PANELS

CROSS-REFERENCE TO RELATED APPLICATION

This application claims priority to and the benefit of Korean Patent Application No. 10-2005-0117985 filed in the Korean Intellectual Property Office on Dec. 6, 2005, the entire contents of which are incorporated herein by reference.

BACKGROUND OF THE INVENTION

1. Field of the Invention

The present invention relates to a manufacturing method for a thin film transistor array panel and a cleansing material for using in the manufacturing method.

2. Description of the Related Art

Flat panel displays such as the liquid crystal display (LCD) and the organic light emitting diode (OLED) display include several pairs of field generating electrodes with electro-optical active layers between them. The LCD uses a liquid crystal layer as the electro-optical active layer while the OLED uses an organic emission layer as the electro-optical active layer. One electrode of a pair of field generating electrodes, i.e., a pixel electrode, is connected to a switching element for transmitting electrical signals to the pixel electrode. The electro-optical active layer converts the electrical signals to optical signals to display an image.

A thin film transistor (TFT) having three terminals is used for the switching element in the flat panel display, and a plurality of signal lines such as gate lines and data lines are also provided on the flat panel display. The gate lines transmit signals for controlling the TFTs and the data lines transmit signals applied to the pixel electrodes.

As the lengths of the gate and data lines increase along with the LCD size, the resistance of the lines and signal delay increases. Conductors made of a material having low resistivity, such as aluminum, are used.

Generally a cleansing material including tetra-methyl ammonium hydroxide (TMAH) is used in manufacturing a display device. However the cleansing material including TMAH may corrode aluminum thereby damaging the signal lines. Because of its poor cleansing properties, the use of ultrapure water is not alone adequate for use in cleaning signal lines made of aluminum.

SUMMARY OF THE INVENTION

A cleansing material for a thin film transistor array panel according to an embodiment of the present invention includes ultrapure water, cyclic amine, pyrogallol, benzotrizole, and methyl glycol. The cleansing material may contain about 85 wt % to about 99 wt % ultra pure water, about 0.01 wt % to about 1.0 wt % cyclic amine, about 0.01 wt % to 1.0 wt % pyrogallol, about 0.01 wt % to 1.0 wt % benzotrizole, and about 0.01 wt % to 1.0 wt % methyl glycol. The cleansing material may preferably contain about 0.1 wt % cyclic amine, about 0.05 wt % pyrogallol, about 0.1 wt % benzotrizole, and about 0.1 wt % methyl glycol, and may preferably contain pyrogallol and benzotrizole of about 2 wt % altogether.

A manufacturing method of a thin film transistor array panel according to an embodiment of the present invention includes depositing a first thin film on a substrate, patterning the first thin film by photolithography and etching, cleansing the substrate including the first thin film, and depositing a second thin film on the cleansed substrate. The cleansing is performed using a cleansing material including ultrapure water, cyclic amine, pyrogallol, benzotrizole, and methyl glycol.

The first thin film may have a double-layered structure of a first layer including aluminum and the second layer including another conductive material. The first thin film may have a triple-layered structure where a first layer includes aluminum, a second layer is disposed thereon, and a third layer disposed thereunder that includes another conductive material.

A manufacturing method of a thin film transistor array panel according to an embodiment of the present invention includes forming a gate line on a substrate, cleansing the substrate including the gate line, depositing a gate insulating layer on the cleansed substrate, forming a semiconductor layer on the gate insulating layer, forming a data line and a drain electrode on the semiconductor layer and the gate insulating layer, and forming a pixel electrode connected to the drain electrode. The cleansing is performed using a cleansing material including ultrapure water, cyclic amine, pyrogallol, benzotrizole, and methyl glycol.

The data line and the drain electrode may have a triple-layered structure of a first layer including aluminum, and a second layer disposed thereon and a third layer disposed thereunder including another conductive material.

The manufacturing method may further include cleansing the substrate including the data line and drain electrode and forming a passivation layer on the cleansed substrate.

DETAILED DESCRIPTION OF THE EMBODIMENTS

First, a thin film transistor (TFT) array panel according to an embodiment of the present invention will be described in detail with reference to FIGS. 1, 2, and 3.

Figure 1:
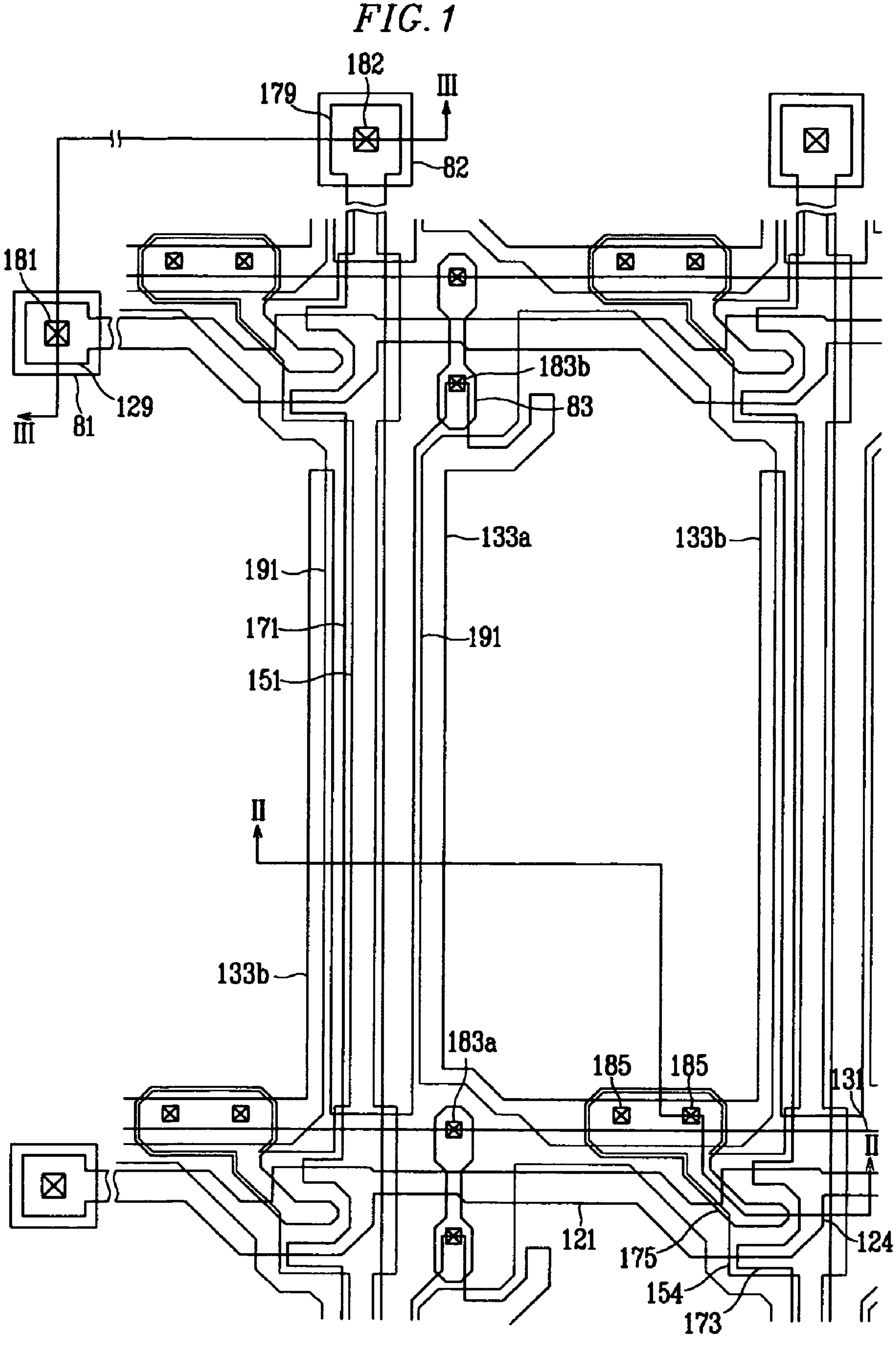
FIG. 1 is a layout view of a TFT array panel according to an exemplary embodiment of the present invention.
Figure 2:
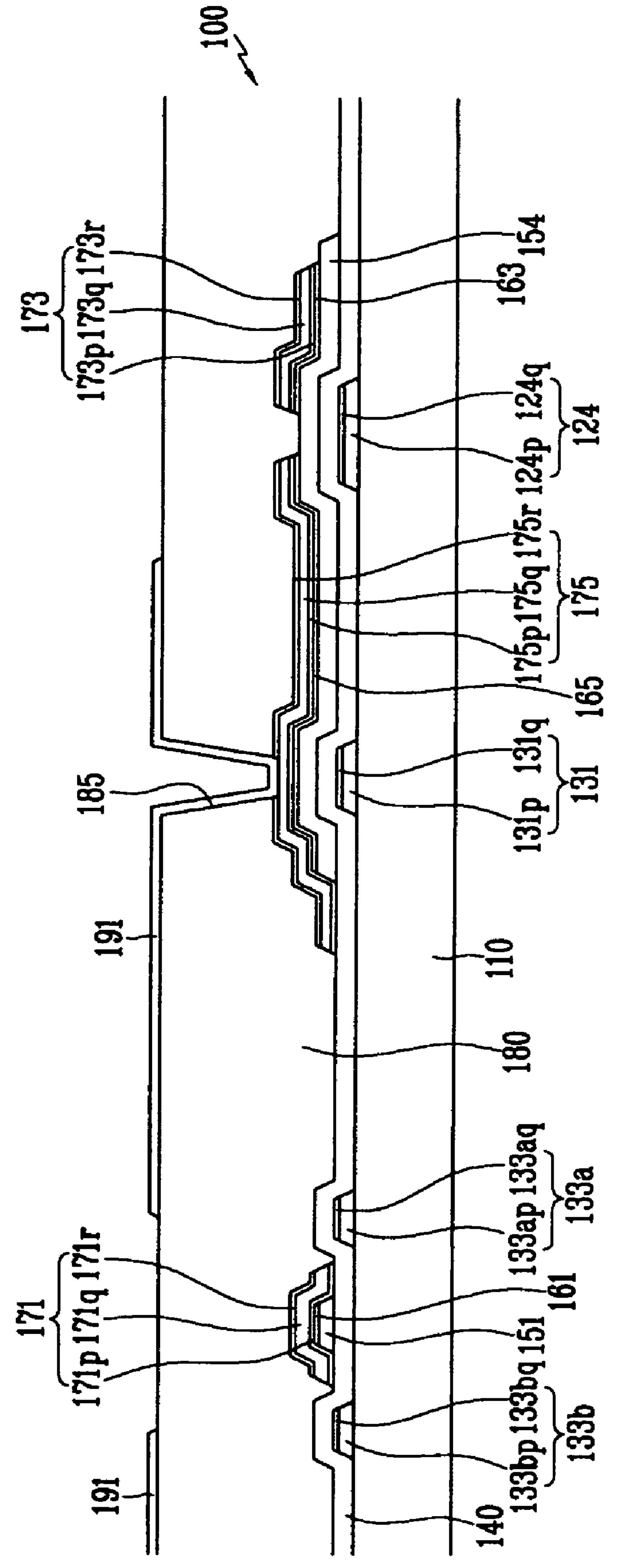
FIG. 2 and FIG. 3 are cross-sectional views the TFT array panel shown in FIG. 1 taken along the lines II-II' and III-III'.
Figure 3:
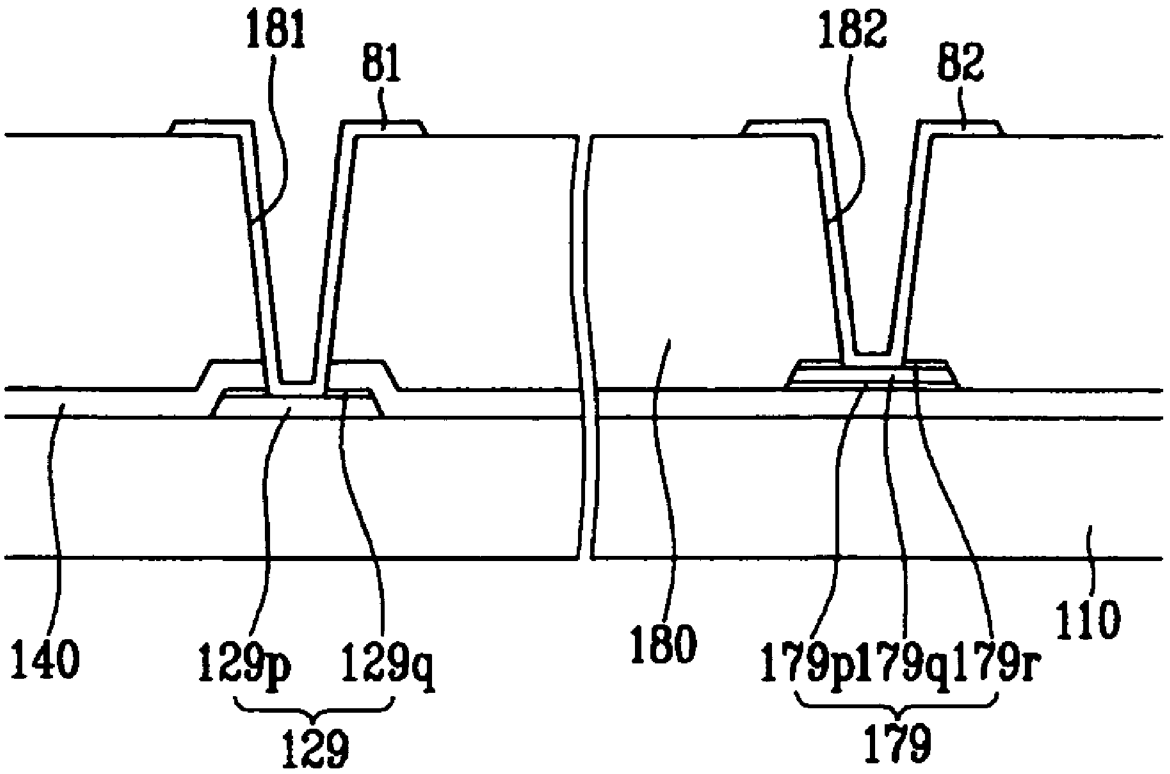

FIG. 1 is a layout view of a TFT array panel according to an exemplary embodiment of the present invention, and FIG. 2 and FIG. 3 are cross-sectional views the TFT array panel shown in FIG. 1 taken along the lines II-II' and III-III'.

A plurality of gate lines 121 and a plurality of storage electrode lines 131 are formed on an insulating substrate 110 made of a material such as transparent glass or plastic.

The gate lines 121 transmit gate signals and extend substantially in a transverse direction. Each of gate lines 121 includes a plurality of gate electrodes 124 projecting downward and an end portion 129 having a large area for contact with another layer or an external driving circuit. A gate driving circuit (not shown) for generating the gate signals may be mounted on a flexible printed circuit (FPC) film (not shown), which may be attached to the substrate 110, directly mounted on the substrate 110, or integrated onto the substrate 110. Gate lines 121 may extend to be connected to a driving circuit that may be integrated onto the substrate 110.

Storage electrode lines 131 are supplied with a predetermined voltage, and each of the storage electrode lines 131 includes a stem 132 extending substantially parallel to the gate lines 121 and a plurality of pairs of first and second storage electrodes 133*a* and 133*b* branched from the stem 132. Each of storage electrode lines 131 is disposed between two adjacent gate lines 121, and stem 132 is close to one of the two adjacent gate lines 121. Each of the storage electrodes 133*a* and 133*b* has a fixed end portion connected to the stem 132 and a free end portion disposed opposite thereto. The fixed end portion of the first storage electrode 133*a* has a large area and the free end portion thereof is bifurcated into a linear branch and a curved branch. However, the storage electrode lines 131 may have various shapes and arrangements.

Gate lines 121 and storage electrode lines 131 include two conductive films disposed thereon, i.e., a lower film and an upper film, which have different physical characteristics. The lower film may be made of a low resistivity metal including an Al-containing metal such as Al and an Al alloy for reducing signal delay or voltage drop. However, the lower film may be made of an Ag-containing metal such as Ag and an Ag alloy or a Cu-containing metal such as Cu and a Cu alloy. The upper film may be made of material such as a Mo-containing metal such as Mo and a Mo alloy, Cr, Ta, and Ti, which has good physical, chemical, and electrical contact characteristics with other materials such as indium tin oxide (ITO) or indium zinc oxide (IZO).

However, the lower film may be made of a good contact material, and the upper film may be made of a low resistivity material. In this case, the upper film 129*q* of the end portions 129 of the gate lines 121 may be removed to expose the lower film 129*p*. In addition, the gate lines 121 and the storage electrode lines 131 may include a single layer that is preferably made of the above-described materials. Otherwise, the gate lines 121 and the storage electrode lines 131 may be made of various metals or conductors.

In FIG. 2 and FIG. 3, for the gate electrodes 124, the storage electrode lines 131, and the storage electrodes 133*a* and 133*b*, the lower and upper films thereof are denoted by additional characters p and q, respectively.

The lateral sides of gate lines 121 and storage electrode lines 131 are inclined relative to a surface of substrate 110, and the inclination angle thereof ranges from about 30 to 80 degrees.

A gate insulating layer 140 preferably made of silicon nitride (SiNx) or silicon oxide (SiOx) is formed on gate lines 121 and storage electrode lines 131.

A plurality of semiconductor stripes 151 preferably made of hydrogenated amorphous silicon (abbreviated to "a-Si") or polysilicon are formed on gate insulating layer 140. Each of semiconductor stripes 151 extends substantially in the longitudinal direction and includes a plurality of projections 154 branched out toward gate electrodes 124. Semiconductor stripes 151 become wide near gate lines 121 and storage electrode lines 131 such that the semiconductor stripes 151 cover large areas of gate lines 121 and storage electrode lines 131.

A plurality of ohmic contact stripes and islands 161 and 165 are formed on semiconductor stripes 151. Ohmic contacts 161 and 165 are preferably made of n+ hydrogenated a-Si heavily doped with an n-type impurity such as phosphorous, or they may be made of silicide. Each of ohmic contact stripes 161 includes a plurality of projections 163, and the projections 163 and the ohmic contact islands 165 are located in pairs on projections 154 of semiconductor stripes 151.

The lateral sides of semiconductor stripes 151 and ohmic contacts 161 and 165 are inclined relative to the surface of the substrate 110, and the inclination angles thereof are preferably in a range of about 30 to 80 degrees.

A plurality of data lines 171 and a plurality of drain electrodes 175 are formed on ohmic contact 161 and 165 and gate insulating layer 140.

Data lines 171 transmit data signals and extend substantially in the longitudinal direction to intersect gate lines 121. Each of data lines 171 also intersects storage electrode lines 131 and runs between adjacent pairs of storage electrodes 133*a* and 133*b*. Each data line 171 includes a plurality of source electrodes 173 projecting toward gate electrodes 124 and curved like a character J, and an end portion 179 having a large area for contact with another layer or an external driving circuit. A data driving circuit (not shown) for generating the data signals may be mounted on an FPC film (not shown), which may be attached to substrate 110, directly mounted on substrate 110, or integrated onto substrate 110. Data lines 171 may extend to be connected to a driving circuit that may be integrated onto substrate 110.

Drain electrodes 175 are separated from data lines 171 and disposed opposite source electrodes 173 with respect to gate electrodes 124. Each of drain electrodes 175 includes a wide end portion and a narrow end portion. The wide end portion overlaps a storage electrode line 131 and the narrow end portion is partly enclosed by a source electrode 173.

A gate electrode 124, a source electrode 173, and a drain electrode 175 along with a projection 154 of a semiconductor stripe 151 form a TFT having a channel formed in the projection 154 disposed between source electrode 173 and drain electrode 175.

Data line 171 and drain electrode 175 have a triple-layered structure including a lower film 171*p* and 175*p*, an intermediate film 171*q* and 175*q*, and an upper film 171*r* and 175*r*, respectively. The lower films 171*p* and 175*p* may be made of a refractory metal such as Mo, Cr, Ta, Ti, or alloys thereof, the intermediate films 171*q* and 175*q* may be made of an Al-containing metal having low resistivity, and the upper films 171*r* and 175*r* may be made of a refractory metal or alloys thereof having a good contact characteristic with ITO or IZO. An example of the triple-layered structure is a lower Mo (alloy) film, an intermediate Al (alloy) film, and an upper Mo (alloy) layer.

Data line 171 and drain electrode 175 may have a double-layered structure including a refractory-metal lower film (not shown) and a low-resistivity upper film (not shown), or a single-layer structure preferably made of the above-described materials. A good example of the combination of the two films is a lower Mo (alloy) film and an upper Al (alloy) film. However, the data lines 171 and the drain electrodes 175 may be made of various metals or conductors.

In FIGS. 2 and 3, the lower, the intermediate, and the upper films of data line 171, source electrodes 173, drain electrodes 175, and the end portion 179 of data line 171 are denoted by additional characters p, q, and r, respectively.

Data lines 171 and drain electrodes 175 have inclined edge profiles, and the inclination angles thereof range from about 30 to 80 degrees.

Ohmic contacts 161 and 165 are interposed only between the underlying semiconductor stripes 151 and the overlying conductors 171 and 175 thereon, and reduce the contact resistance therebetween. Although semiconductor stripes 151 are narrower than data lines 171 at most places, the width of semiconductor stripes 151 becomes large near gate lines 121 and storage electrode lines 131 as described above, to smooth the profile of the surface, thereby preventing disconnection of data lines 171. However, semiconductor stripes 151 include some exposed portions, which are not covered the data lines 171 and drain electrodes 175, such as portions located between source electrodes 173 and drain electrodes 175.

A passivation layer 180 is formed on data lines 171, drain electrodes 175, and the exposed portions of semiconductor stripes 151. The passivation layer 180 may be made of an inorganic insulator or organic insulator, and it may have a flat top surface. Examples of the inorganic insulator material include silicon nitride and silicon oxide. The organic insulator may have photosensitivity and a dielectric constant of less than about 4.0. The passivation layer 180 may include a lower film of an inorganic insulator and an upper film of an organic insulator, such that it takes the excellent insulating characteristics of the organic insulator while preventing the exposed portions of the semiconductor stripes 151 from being damaged by the organic insulator.

Passivation layer 180 has a plurality of contact holes 182 and 185 exposing intermediate film 179*q* of the end portions 179 of data lines 171 and intermediate film 175*q* of drain electrodes 175, respectively.

Passivation layer 180 and gate insulating layer 140 have a plurality of contact holes 181 exposing lower films 129*p* of the end portions 129 of the gate lines 121, a plurality of contact holes 183*a* exposing portions of lower films 133*ap* of storage electrode lines 131 near the fixed end portions of the storage electrodes 133*a*, and a plurality of contact holes 183*b* exposing lower film 133*bp* of the linear branches of the free end portions of first storage electrodes 133*a*.

A plurality of pixel electrodes 191, a plurality of overpasses 83, and a plurality of contact assistants 81 and 82 are formed on passivation layer 180 that are preferably made of a transparent conductor such as ITO or IZO, or a reflective conductor such as Ag, Al, or alloys thereof.

Pixel electrodes 191 are physically and electrically connected to drain electrodes 175 through contact holes 185 such that pixel electrodes 191 receive data voltages from drain electrodes 175. Pixel electrodes 191 supplied with the data voltages generate electric fields in cooperation with a common electrode (not shown) of an opposing display panel (not shown) supplied with a common voltage, which determine the orientations of liquid crystal molecules (not shown) of a liquid crystal layer (not shown) disposed between the two electrodes. A pixel electrode 191 and common electrode form a capacitor referred to as a "liquid crystal capacitor," which stores applied voltages after the TFT is turned off.

A pixel electrode 191 and a drain electrode 175 connected thereto overlap a storage electrode line 131 including storage electrodes 133*a* and 133*b*. Pixel electrode 191, a drain electrode 175 connected thereto, and the storage electrode line 131 form an additional capacitor referred to as a "storage capacitor," which enhances the voltage storing capacity of the liquid crystal capacitor.

Contact assistants 81 and 82 are connected to the end portions 129 of the gate lines 121 and the end portions 179 of data lines 171 through contact holes 181 and 182, respectively. Contact assistants 81 and 82 protect the end portions 129 and 179 and enhance adhesion between the end portions 129 and 179 and external devices.

The overpasses 83 cross over gate lines 121 and are connected to the exposed portions of storage electrode lines 131 and the exposed linear branches of the free end portions of storage electrodes 133*b* through contact holes 183*a* and 183*b*, respectively, which are disposed opposite each other with respect to gate lines 121. Storage electrode lines 131 including storage electrodes 133*a* and 133*b* along with overpasses 83 can be used for repairing defects in gate lines 121 the data lines 171, or TFTs.

A method of manufacturing the TFT array panel shown in FIG. 1 to FIG. 3 according to an embodiment of the present invention will be described in detail with reference to FIG. 4 to FIG. 15 as well as FIG. 1 to FIG. 3.

Figure 11:
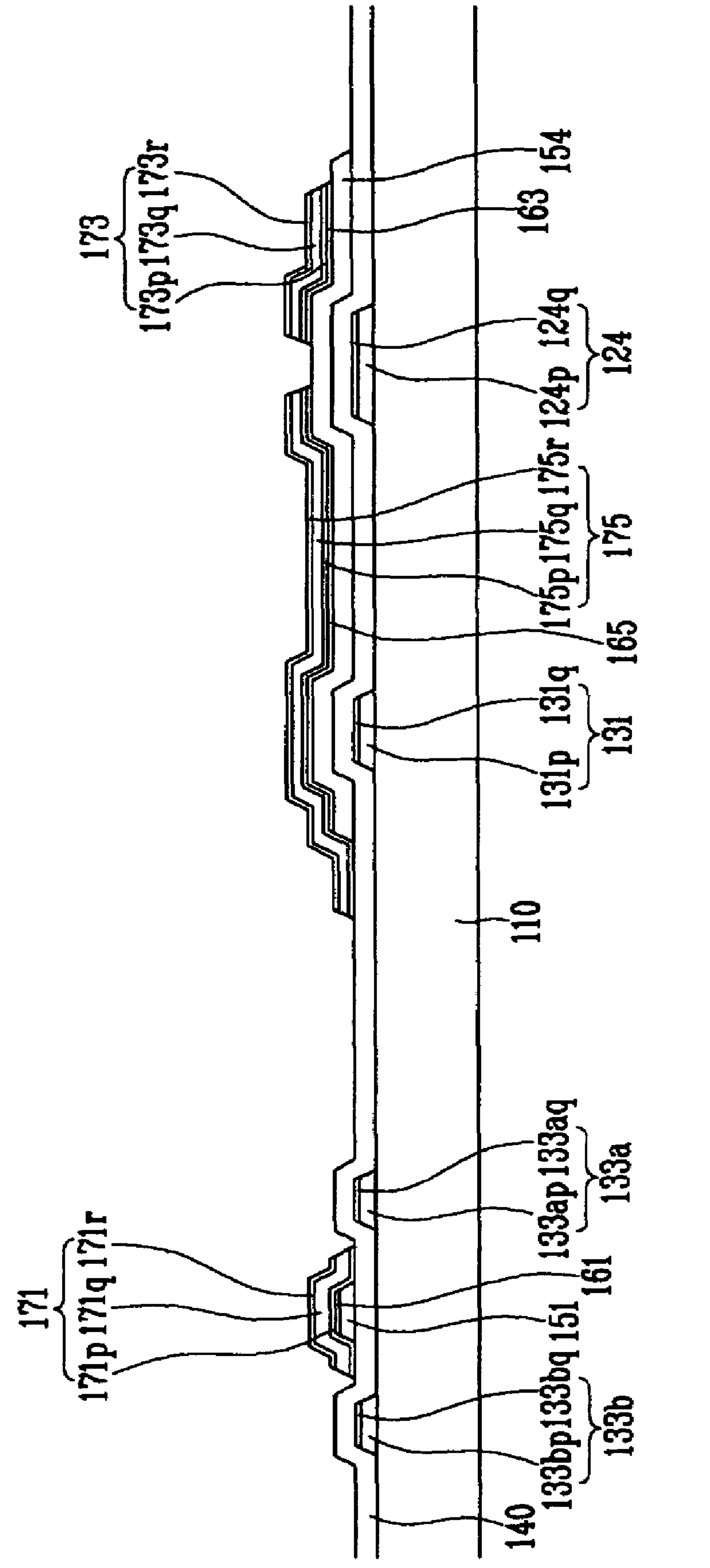
FIG. 11 and FIG. 12 are sectional views of the TFT array panel shown in FIG. 10 taken along the lines XI-XI' and XII-XII'.
Figure 12:
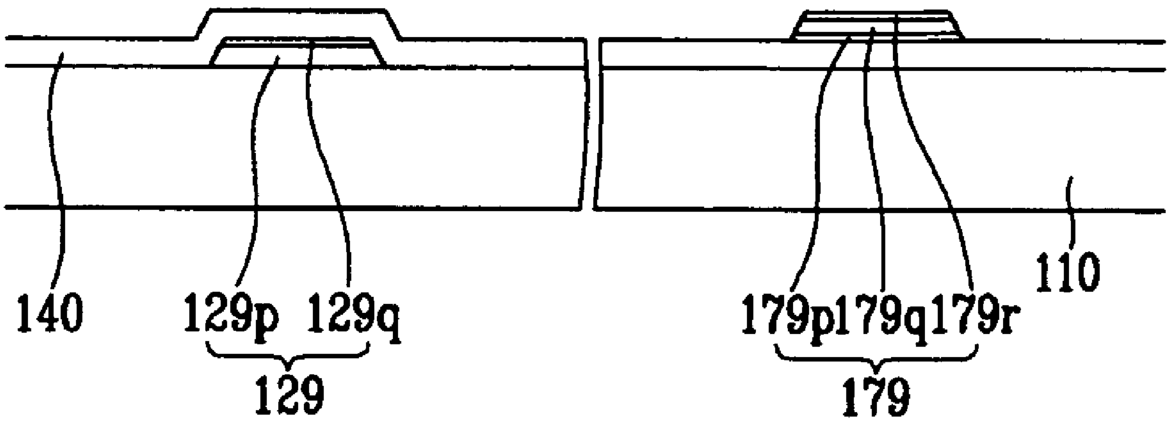
Figure 13:
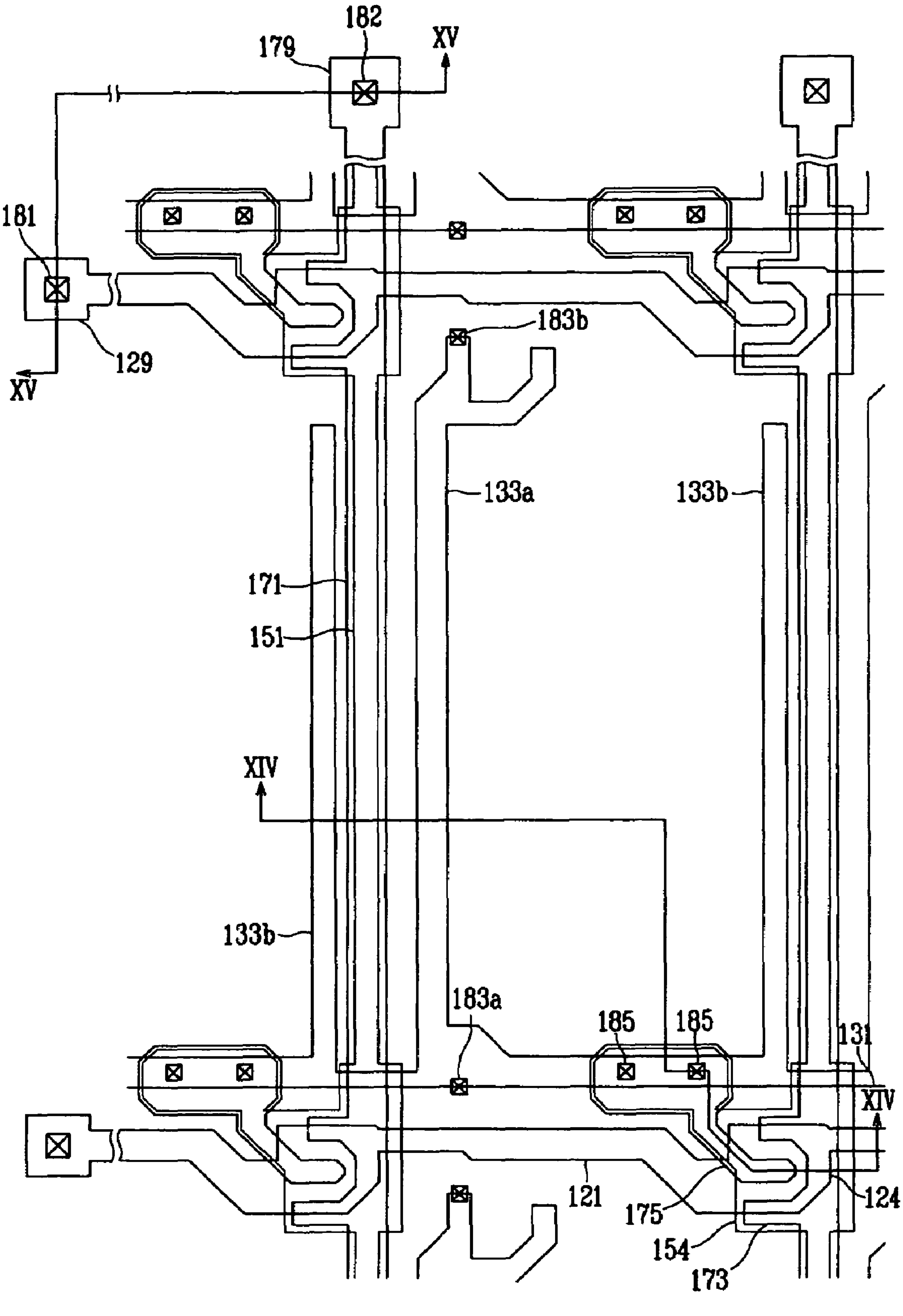
Figure 14:
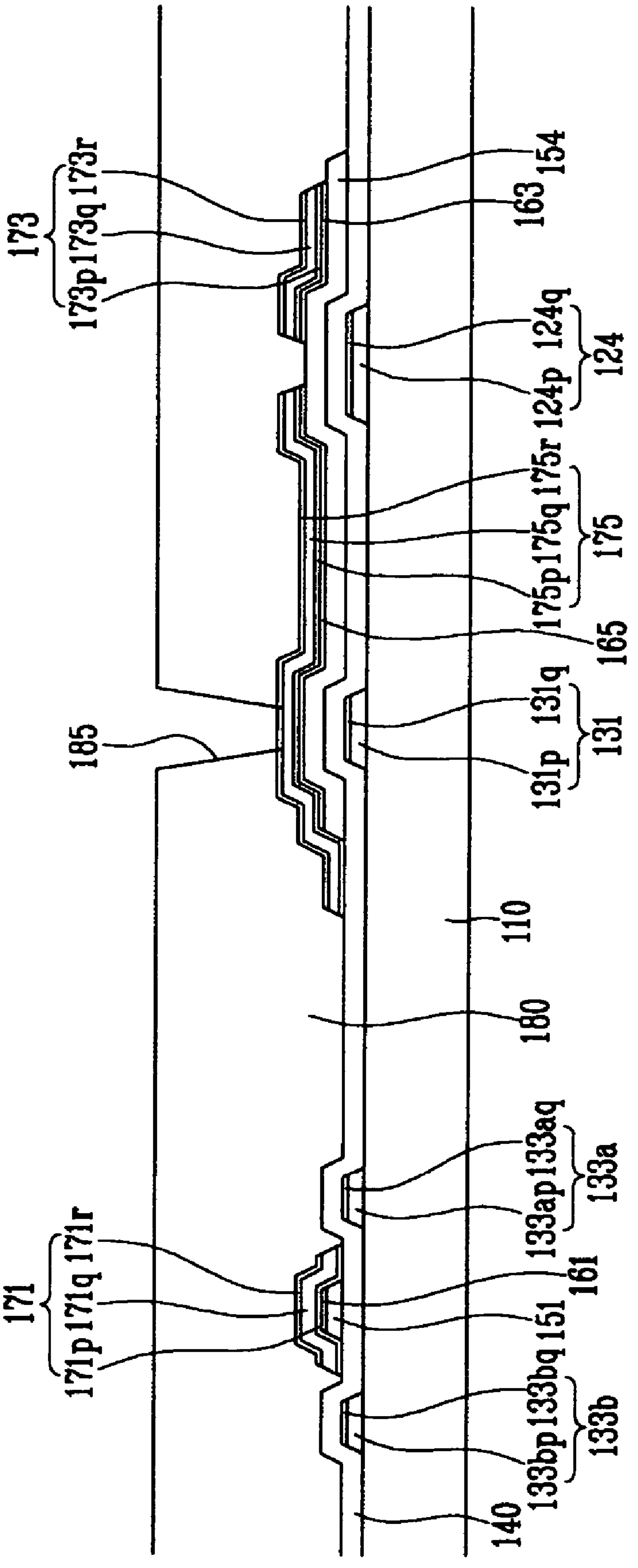
FIG. 14 and FIG. 15 are sectional views of the TFT array panel shown in FIG. 13 taken along the lines XIV-XIV' and XV-XV'.
Figure 15:
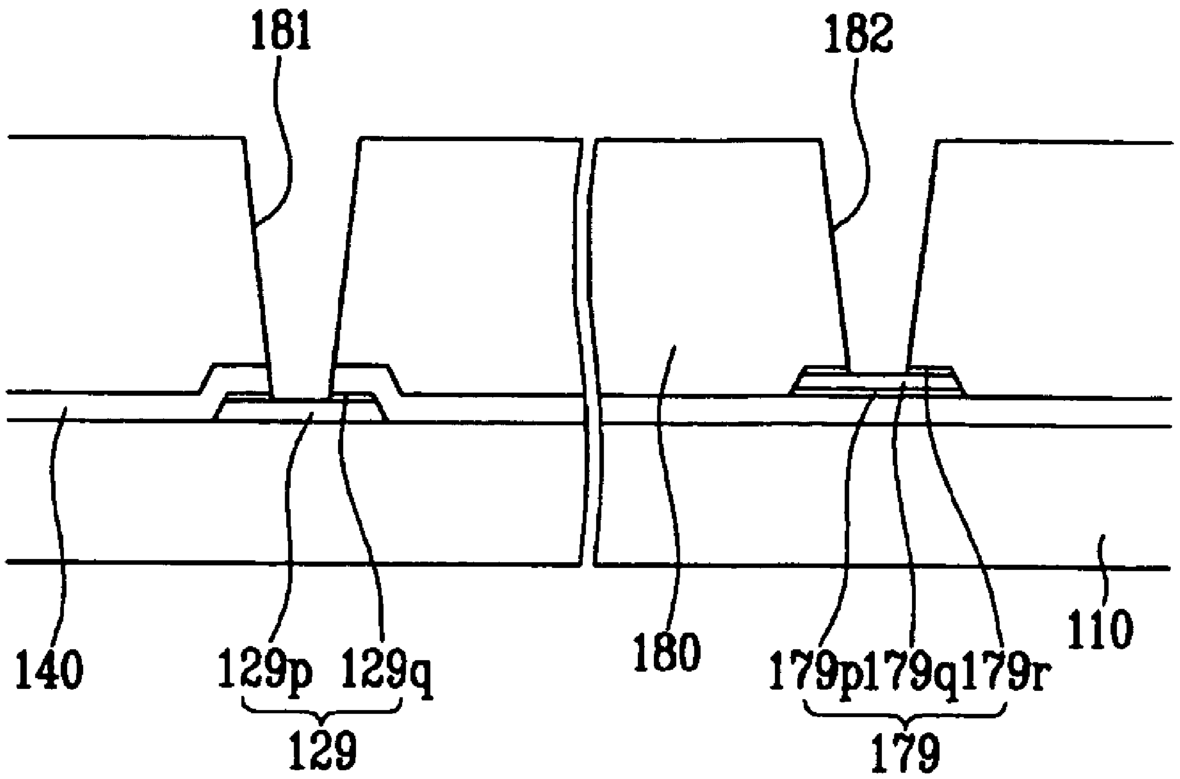

FIG. 4, FIG. 7, FIG. 10, and FIG. 13 are layout views of the TFT array panel in intermediate steps of a manufacturing method according to an embodiment of the present invention. FIG. 5 and FIG. 6 are sectional views of the TFT array panel shown in FIG. 4 taken along the lines V-V' and VI-VI', FIG. 8 and FIG. 9 are sectional views of the TFT array panel shown in FIG. 7 taken along the lines VIII-VIII' and IX-IX', FIG. 11 and FIG. 12 are sectional views of the TFT array panel shown in FIG. 10 taken along the lines XI-XI' and XII-XII', and FIG. 14 and FIG. 15 are sectional views of the TFT array panel shown in FIG. 13 taken along the lines XIV-XIV' and XV-XV'.

Figure 4:
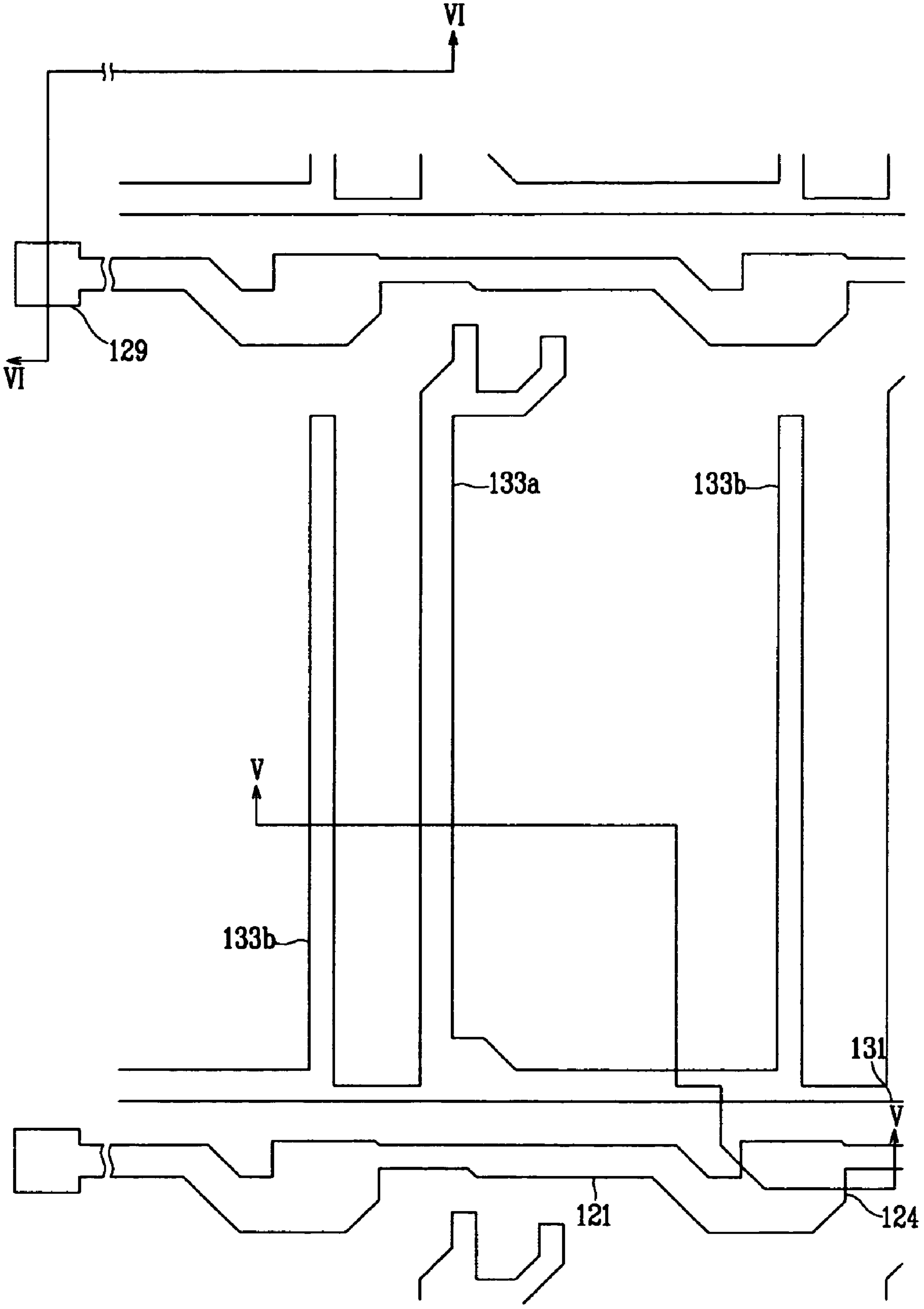
FIG. 4, FIG. 7, FIG. 10, and FIG. 13 are layout views of the TFT array panel in intermediate steps of a manufacturing method thereof according to an embodiment of the present invention.
Figure 5:
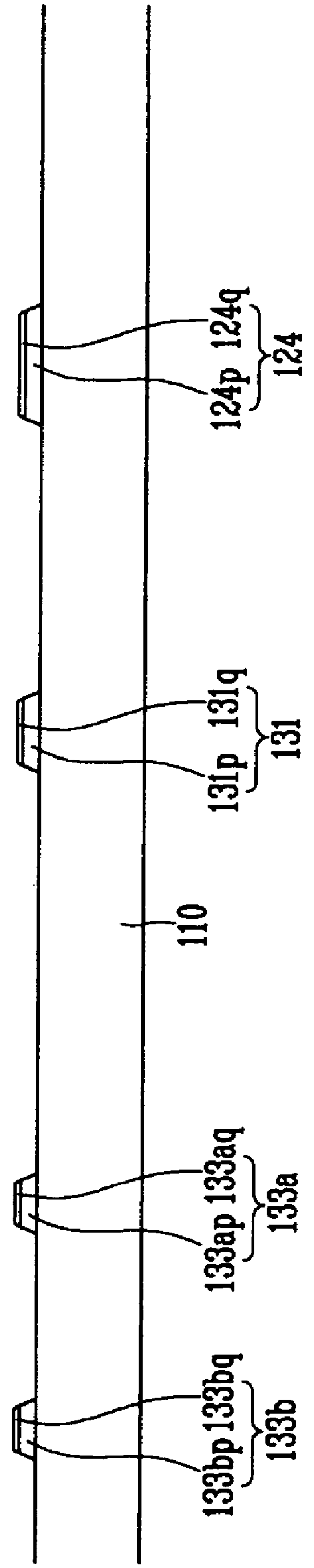
FIG. 5 and FIG. 6 are sectional views of the TFT array panel shown in FIG. 4 taken along the lines V-V' and VI-VI'.
Figure 6:
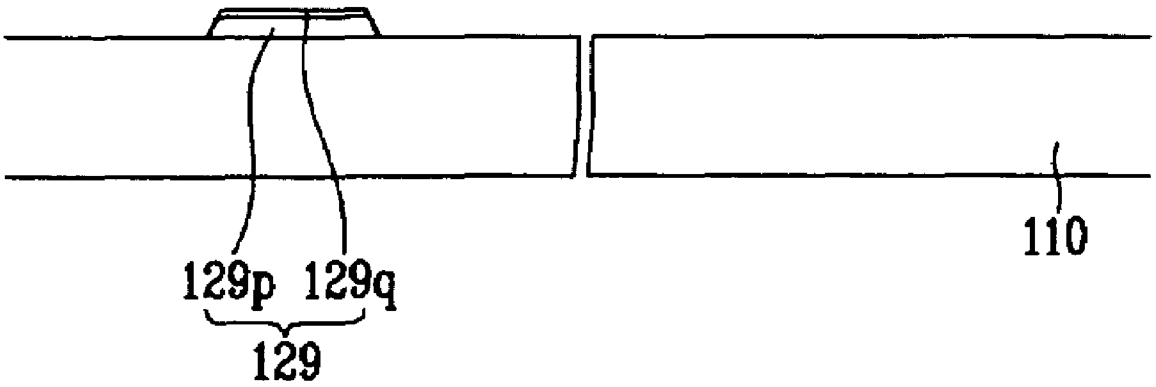

Referring to FIG. 4 to FIG. 6, a lower film including aluminum and an upper film including molybdenum are sequentially deposited on an insulating substrate 110, and then the upper film and the lower film are patterned by photolithography and etching to form a plurality of gate lines 121 including gate electrodes 124 and end portions 129 and a plurality of storage electrode lines 131 including storage electrodes 133*a* and 133*b*.

In FIG. 4 to FIG. 15, for the end portions 129 of the lines 121, gate electrodes 124, storage electrode lines 131, and storage electrodes 133*a* and 133*b*, the lower and upper films thereof are denoted by additional characters p and q, respectively.

Next, substrate 110 having the gate lines and the storage electrode lines 131 is rinsed using a cleansing material according to an embodiment of the present invention.

The cleansing material (ATC-2000) according to an embodiment of the present invention includes ultrapure water, cyclic amine, pyrogallol, benzotrizole, and methyl glycol. The cleansing material may contain about 85 wt % to about 99 wt % ultra pure water, about 0.01 wt % to about 1.0 wt % cyclic amine, about 0.01 wt % to 1.0 wt % pyrogallol, about 0.01 wt % to 1.0 wt % benzotrizole, and about 0.01 wt % to 1.0 wt % methyl glycol. The cleansing material may preferably contain about 0.1 wt % cyclic amine, about 0.05 wt % pyrogallol, about 0.1 wt % benzotrizole, and about 0.1 wt % methyl glycol, and may preferably contain pyrogallol and benzotrizole of about 2 wt % altogether.

Figure 7:
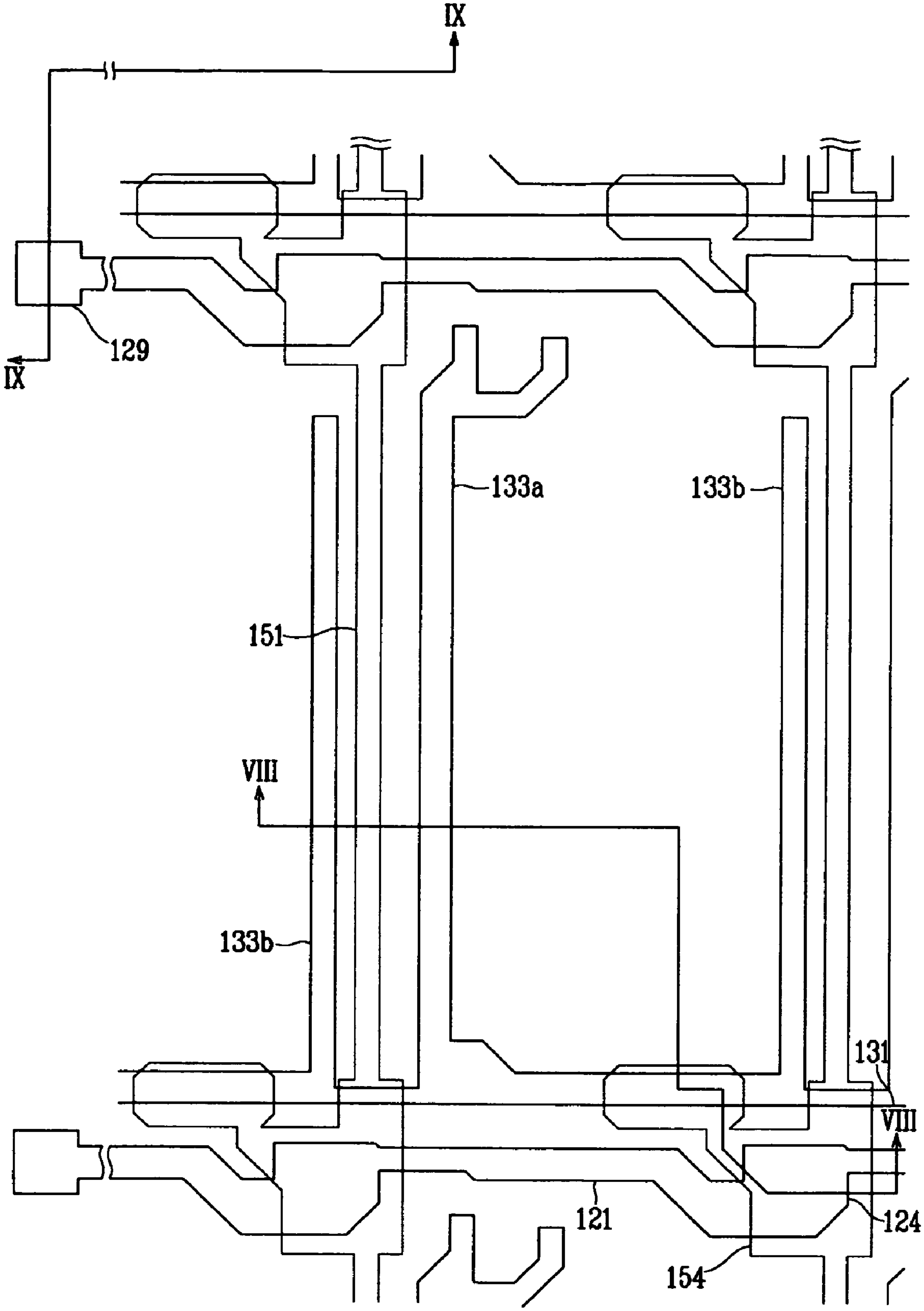
Figure 8:
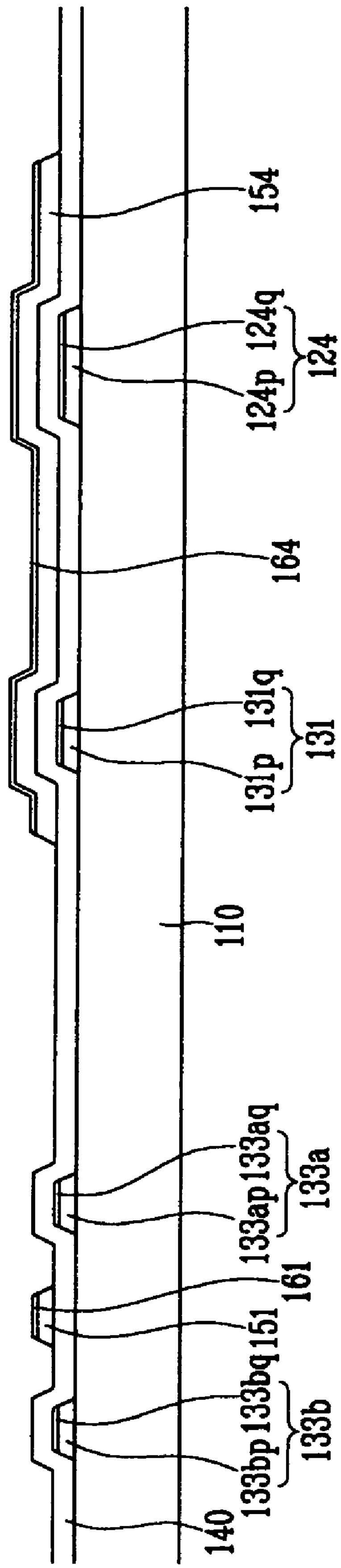
FIG. 8 and FIG. 9 are sectional views of the TFT array panel shown in FIG. 7 taken along the lines VIII-VIII' and IX-IX'.
Figure 9:
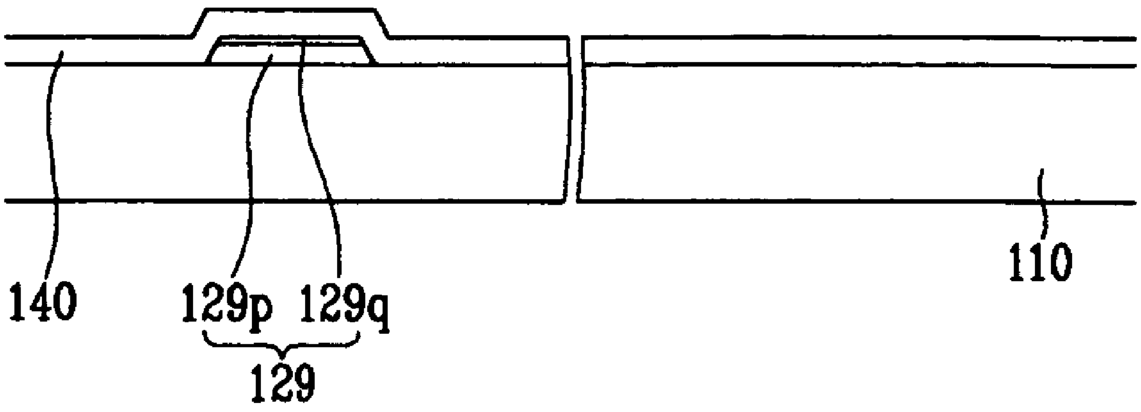
Figure 10:
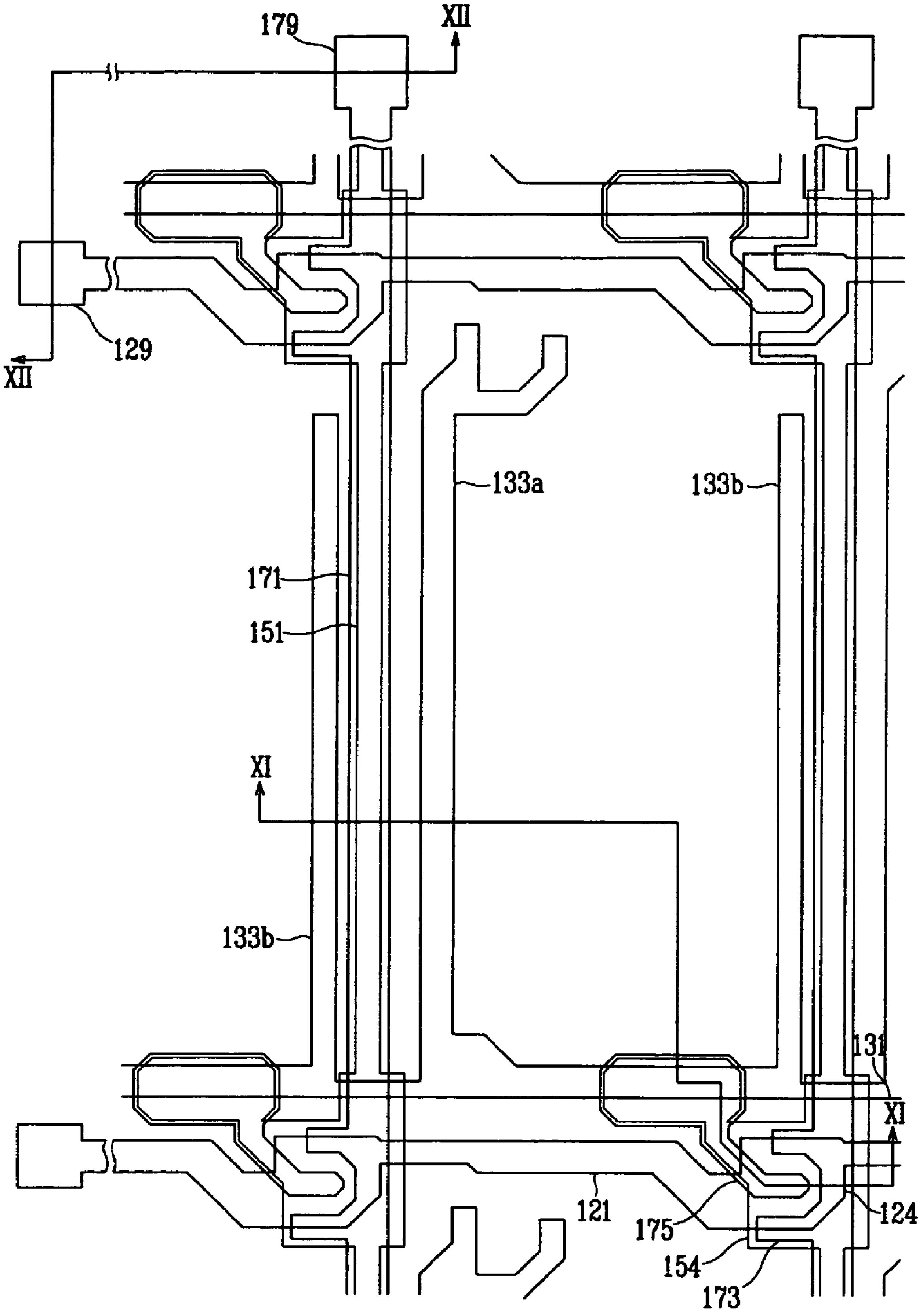

After rinsing the substrate 110 using the cleansing material (ATC-2000), a gate insulating layer 140, an intrinsic a-Si layer, and an extrinsic a-Si layer are sequentially deposited on the gate lines 121 and the storage electrode lines 131, and then the extrinsic a-Si layer and the intrinsic a-Si layer are patterned by photolithography and etching to form a plurality of extrinsic semiconductor stripes 161 including projections 164 and a plurality of (intrinsic) semiconductor stripes 151 including projections 154 as shown in FIG. 7 to FIG. 9.

Next, substrate 110 is rinsed using the cleansing material (ATC-2000) according to an embodiment of the present invention. The cleansing material (ATC-2000) may include ultrapure water at about 85 wt % to about 99 wt %, cyclic amine at about 0.01 wt % to about 1.0 wt %, pyrogallol at about 0.01 wt % to about 1.0 wt %, benzotrizole at about 0.01 wt % to about 1.0 wt %, and methyl glycol at about 0.01 wt % to about 1.0 wt %.

A lower film including molybdenum, an intermediate film including aluminum, and an upper film including molybdenum are sequentially deposited on the extrinsic semiconductor stripes 161 and 164 and the gate insulating layer 140, and then the upper film, the intermediate film, and the lower film are patterned by photolithography and etching to form a plurality of data lines 171 including source electrodes 173 and end portions 179 and a plurality of drain electrodes 175 as shown in FIG. 10 to FIG. 13. In FIG. 10 to FIG. 15, the lower, the intermediate, and the upper films of the data line 171, the source electrodes 173, the drain electrodes 175, and the end portion 179 of the data line 171 are denoted by additional characters p, q, and r, respectively. Thereafter, exposed portions of the extrinsic semiconductor stripes 164, which are not covered with the data lines 171 and the drain electrodes 175, are removed to complete a plurality of ohmic contact stripes 161 including projections 163 and a plurality of ohmic contact islands 165 and to expose portions of the intrinsic semiconductor stripes 151.

Next, substrate 100 is rinsed using the cleansing material ATC-2000 according to an embodiment of the present invention. Referring to FIG. 13 to FIG. 15, a passivation layer 180 is deposited and patterned by photolithography (and etching) along with gate insulating layer 140 to form a plurality of contact holes 181, 182, 183*a*, 183*b*, and 185 exposing the upper films 129*q*, 179*r*, 131*q*, 133*aq*, and 175*r* of the end portions 129 of the gate lines 121, the end portions 179 of data lines 171, storage electrode lines 131 near the fixed end portions of the first storage electrodes 133*a*, the linear branches of the free end portions of the first storage electrodes 133*a*, and the drain electrodes 175, respectively.

The upper films 129*q*, 179*r*, 131*q*, 133*aq*, and 175*r* that are exposed through the contact holes 181, 182, 183*a*, 183*b*, and 185, respectively, are etched to expose the lower films 129*p*, 131*p*, and 133*ap* or the intermediate films 179*q* and 175*q*. Thereafter, the substrate 100 is rinsed using the cleansing material ATC-2000 according to an embodiment of the present invention.

After rinsing substrate 110, a plurality of pixel electrodes 191, a plurality of contact assistants 81 and 82 and a plurality of overpasses 83 are formed on the passivation layer 180 as shown in FIG. 1 to FIG. 3.

Now, an experimental example regarding the cleansing extent of the cleansing material ATC-2000 according to an embodiment of the present invention will be described referring to FIG. 19 and FIG. 20.

Figure 16:
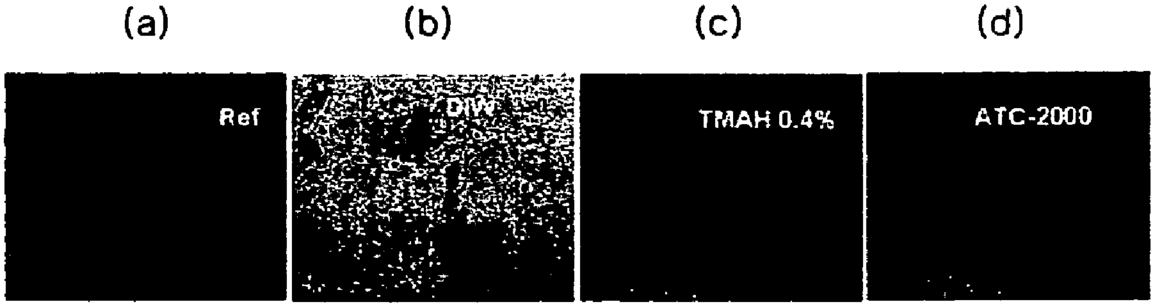
FIG. 16 and FIG. 17 represent cleansing results using a cleansing material according to an exemplary embodiment of the present invention measured by a microscope.
Figure 17:
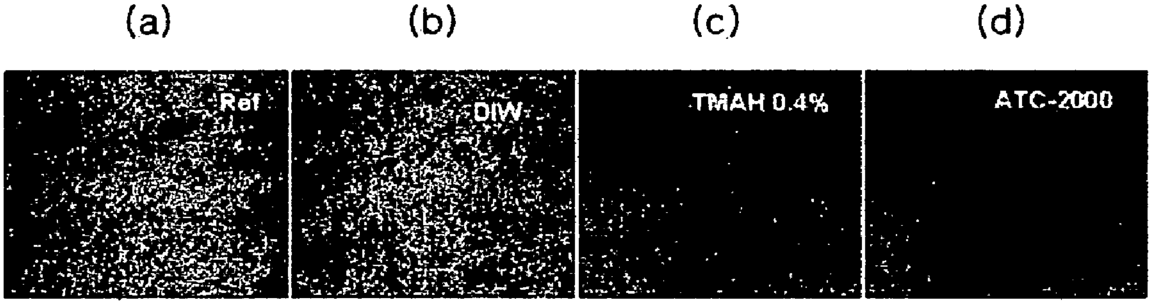

FIG. 16 and FIG. 17 represent cleansing results using a cleansing material according to an exemplary embodiment of the present invention, evaluated with a microscope.

In the experimental example, substrates made of glass were purposely contaminated by a fingerprint or dust particles, the substrate were cleansed using ultrapure water, a known cleansing material including TMAH at about 0.4%, and the cleansing material ATC-2000 according to an embodiment of the present invention for one minute, respectively, and then the substrates were evaluated using a microscope. Here, the other conditions were the same except the cleansing material.

In FIG. 16, the surface of the contaminated substrates by a fingerprint are shown in (a), and the substrates cleansed using ultrapure water, the known cleansing material including TMAH of about 0.4 wt %, and the cleansing material ATC-2000 are shown in (b), (c), and (d), respectively. As shown in FIG. 16, the cleansing using the known cleansing material including TMAH at about 0.4 wt % and the cleansing material ATC-2000 were better than that using ultrapure water, and the cleansing using the known cleansing material including TMAH at about 0.4 wt % and the cleansing material ATC-2000 were similar to each other.

The surfaces of the substrates contaminated by dust particles are shown in FIG. 17(*a*), and the substrates cleansed using ultrapure water, the known cleansing material including TMAH at about 0.4 wt % and the cleansing material ATC-2000 are shown in FIG. 17(*b*), (*c*), and (*d*), respectively. As shown in FIG. 17(*b*), the dust particles were hardly removed using ultrapure water, but the dust particles were almost completely removed using the known cleansing material including TMAH at about 0.4 wt % and the cleansing material ATC-2000 as shown in FIGS. 17(*c*) and (*d*).

As described above, the cleansing extent of the cleansing material ATC-2000 according to an embodiment of the present invention is similar to that of the known cleansing material including TMAH.

Next, an experimental example regarding cleansing extent of the cleansing material ATC-2000 according to an embodiment of the present invention and the known cleansing material including TMAH will be described.

In the experimental example, the contact angle of water relative to the substrates was measured before and after the substrates were cleansed and before and after an ITO film and an organic film were formed on substrates. The substrates were cleansed using the cleansing material according to an embodiment of the present invention and the known cleansing material including TMAH at about 0.4 wt %, and the substrates were cleansed for three minutes and five minutes, respectively. The other conditions were the same except the cleansing material. The contact angles according to the experiment are shown in Table 1.

TABLE 1

| | Cleansing time (minutes) | Before cleansing | After cleansing using the cleansing material including TMAH | After cleansing using the cleansing material ATC-2000 |
|---|---|---|---|---|
| Substrate | 3 | 41.53 | 12.32 | 16.53 |
| | 5 | | 11.08 | 12.15 |
| ITO film | 3 | 45.40 | 26.44 | 33.33 |
| | 5 | | 25.53 | 24.90 |
| Organic film | 3 | 67.93 | 61.22 | 61.47 |
| | 5 | | 59.88 | 59.97 |

Referring to Table 1, the contact angle of water relative to the substrate having no film decreased significantly after cleansing using the cleansing material including TMAH or the cleansing material ATC-2000. The contact angle of water relative to the substrate having no film decreased depending on the time of cleansing.

In the substrates having an ITO film or an organic film, the contact angle of water relative to the substrate decreased after cleansing, and the decrement of the contact angle relative to the substrate cleansed using the cleansing material ATC-2000 was similar to or greater than that of the contact angle relative to the substrate cleansed using the cleansing material including TMAH.

As described above, the contact angle of water relative to the substrate decreased after cleansing using the cleansing material including TMAH or the cleansing material ATC- 2000, and each decrement of the contact angles relative to the substrates cleansed using the cleansing material including TMAH or the cleansing material ATC-2000 decreased similarly.

Generally, a small contact angle of water relative to a surface means that the surface is highly hydrophilic, which indirectly indicates that dust materials on the surface are removed a lot. Accordingly, the cleansing material ATC-2000 according to an embodiment of the invention has a cleansing extent similar to the known cleansing material including TMAH.

Now, an experimental example regarding aluminum corrosion by the cleansing material ATC-2000 according to an embodiment of the present invention and the known cleansing material including TMAH will be described.

In the experimental example, aluminum thin films of about 640 nm were formed on substrates, respectively, the substrates having an aluminum thin film were cleansed using the cleansing material ATC-2000 and the known cleansing material including TMAH, respectively, and then the thickness of the aluminum thin films were measured. Here, the other conditions were the same except the cleansing material. The results according to the experiment are shown in Table 2.

TABLE 2

| | Cleansing time | | | Erosion rate |
|---|---|---|---|---|
| | 30 minutes | 1 hour | 2 hours | (nm/min) |
| TMAH | 599 | 426 | 0 | 3.56 |
| ATC-2000 | 640 | 637 | 638 | 0 |

Referring to Table 2, the aluminum thin film was damaged after the aluminum thin film was cleansed using the known cleansing material including TMAH. On the other hand, the aluminum thin film was hardly damaged after the aluminum thin film was cleansed using the cleansing material ATC-2000 according to an embodiment of the present invention.

According to above experimental examples, the cleansing material ATC-2000 according to an embodiment of the present invention has not only a good cleansing extent but also causes minimal or no damage to aluminum.

As described above, the cleansing material ATC-2000 according to an embodiment of the present invention is used in a manufacturing method of the TFT array panel including aluminum conductors to cleanse dust and other particulates and to prevent corrosion of aluminum conductors.

While this invention has been described in connection with what is presently considered to be practical exemplary embodiments, it is to be understood that various modifications will be apparent to those skilled in the art and may be made without, however, departing from the spirit and scope of the invention.

What is claimed is:

1. A manufacturing method of a thin film transistor array panel, comprising:
- depositing a first thin film on a substrate;
- patterning the first thin film by photolithography and etching;
- cleansing the substrate including the first thin film with a cleansing material comprising ultrapure water, cyclic amine, pyrogallol, benzotriazole, and methyl glycol
- depositing a second thin film on the cleansed substrate.

2. The manufacturing method of claim 1, wherein the cleansing material contains about 85 wt % to about 99 wt % ultrapure water.

3. The manufacturing method of claim 1, wherein the cleansing material contains about 85 wt % to about 99 wt % cyclic amine.

4. The manufacturing method of claim 1, wherein the cleansing material contains about 0.01 wt % to 1.0 wt % pyrogallol.

5. The manufacturing method of claim 1, wherein the cleansing material contains about 0.01 wt % to 1.0 wt % benzotrizole.

6. The manufacturing method of claim 1, wherein the cleansing material contains about 0.01 wt % to 1.0 wt % methyl glycol.

7. The manufacturing method of claim 1, wherein the cleansing material contains about 0.1 wt % cyclic amine, about 0.05 wt % pyrogallol, about 0.1 wt % benzotrizole, and about 0.1 wt % methyl glycol.

8. The manufacturing method of claim 1, wherein the cleansing material contains pyrogallol and benzotrizole of about 2 wt % altogether.

9. The manufacturing method of claim 1, wherein the first thin film comprises aluminum.

10. The manufacturing method of claim 9, wherein the first thin film has a first layer including aluminum and a second layer including another conductive material.

11. The manufacturing method of claim 9, wherein the first thin film has a first layer including aluminum, a second layer disposed thereon and a third layer disposed thereunder including another conductive material.

12. A manufacturing method of a thin film transistor array panel, comprising:
- forming a gate line on a substrate;
- cleansing the substrate including the gate line;
- depositing a gate insulating layer on the cleansed substrate;
- forming a semiconductor layer on the gate insulating layer;
- forming a data line and a drain electrode on the semiconductor layer and the gate insulating layer; and
- forming a pixel electrode connected to the drain electrode, wherein the cleansing is performed using a cleansing material comprising ultrapure water, cyclic amine, pyrogallol, benzotrizole, and methyl glycol.

13. The manufacturing method of claim 12, wherein the cleansing material contains about 85 wt % to about 99 wt % ultrapure water.

14. The manufacturing method of claim 12, wherein the cleansing material contains about 0.01 wt % to about 1.0 wt % cyclic amine.

15. The manufacturing method of claim 12, wherein the cleansing material contains about 0.01 wt % to 1.0 wt % pyrogallol.

16. The manufacturing method of claim 12, wherein the cleansing material contains about 0.01 wt % to 1.0 wt % benzotrizole.

17. The manufacturing method of claim 12, wherein the cleansing material contains about 0.01 wt % to 1.0 wt % methyl glycol.

18. The manufacturing method of claim 12, wherein the cleansing material contains about 0.1 wt % cyclic amine, about 0.05 wt % pyrogallol, about 0.1 wt % benzotrizole, and about 0.1 wt % methyl glycol.

19. The manufacturing method of claim 12, wherein the cleansing material contains pyrogallol and benzotrizole of about 2 wt % altogether.

20. The manufacturing method of claim 12, wherein the gate line comprises aluminum.

21. The manufacturing method of claim 20, wherein the gate line has a first layer including aluminum and a second layer including another conductive material.

22. The manufacturing method of claim 12, wherein the data line and the drain electrode comprise aluminum.

23. The manufacturing method of claim 22, wherein the data line and drain electrode have a first layer including aluminum, a second layer disposed thereon and a third layer disposed thereunder that includes another conductive material.

24. The manufacturing method of claim 12, further comprising: cleansing the substrate including the data line and drain electrode; and forming a passivation layer on the cleansed substrate.

25. The manufacturing method of claim 24, wherein the cleansing is performed using a cleansing material comprising ultrapure water, cyclic amine, pyrogallol, benzotrizole, and methyl glycol.

26. The manufacturing method of claim 25, wherein the cleansing material contains about 0.1 wt % cyclic amine, about 0.05 wt % pyrogallol, about 0.1 wt % benzotrizole, and about 0.1 wt % methyl glycol.

27. The manufacturing method of claim 25, wherein the cleansing material contains pyrogallol and benzotrizole of about 2 wt % altogether.

* * * * *